US006513389B2

(12) United States Patent
Suresh et al.

(10) Patent No.: US 6,513,389 B2
(45) Date of Patent: Feb. 4, 2003

(54) TECHNIQUE FOR DETERMINING CURVATURES OF EMBEDDED LINE FEATURES ON SUBSTRATES

(75) Inventors: Subra Suresh, Wellesley, MA (US); Tae-Soon Park, Cambridge, MA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/843,612

(22) Filed: Apr. 25, 2001

(65) Prior Publication Data

US 2002/0021452 A1 Feb. 21, 2002

Related U.S. Application Data

(63) Continuation-in-part of application No. 09/560,719, filed on Apr. 27, 2000.
(60) Provisional application No. 60/200,499, filed on Apr. 25, 2000.

(51) Int. Cl.$^7$ .......................... G01N 3/00; G01N 25/16; G01B 11/24; G01B 21/20
(52) U.S. Cl. .......................... 73/785; 73/800; 73/804; 356/601; 374/55; 438/14; 438/16; 702/42; 702/150; 716/4; 716/19
(58) Field of Search .......................... 73/785, 800, 804, 73/762, 787; 374/55; 702/42, 150, 151; 356/601, 521; 438/14, 16; 716/4, 5, 19

(56) References Cited

U.S. PATENT DOCUMENTS

| 4,939,368 A | * | 7/1990 | Brown ...................... 73/800 X |
| 5,227,641 A | | 7/1993 | Cheng ................... 250/559.23 |
| 6,031,611 A | * | 2/2000 | Rosakis et al. ......... 356/521 X |

FOREIGN PATENT DOCUMENTS

| DE | 3424852 A1 | * | 6/1985 | ................... 73/762 |
| JP | 55-131711 | * | 10/1980 | ................... 73/804 |
| JP | 3-122544 | * | 5/1991 | ................... 374/55 |
| JP | 4-366744 | * | 12/1992 | ................... 374/55 |

OTHER PUBLICATIONS

Large Deformation and Geometric Instability of Substrates with Thin–Film Deposits, M. Finot et al., J. Appl. Phys, 81 (8), pp. 3457–3464, Apr. 15, 1997.

Thermoelastic Analysis of Periodic Thin Lines Deposited on a Substrate, A. Wikström, et al., Journal of the Mechanics and Physics of Solids, pp. 1113–1129, Sep. 1, 1998.

Nano–Indentation of Copper Thin Films on Silicon Substrates, S. Suresh, et al., Scripta Materialia, vol. 41, No. 9, pp. 951–957, Aug. 6, 1999.

Substrate Curvature Due to Thin Film Mismatch Strain in the Nonlinear Deformation Range, L.B. Freund, Jan. 20, 1999 20 pages.

Curvature of a Film–Substrate System in the Nonlinear Deformation Range, L.B. Freund, et al., undated but 5, Apr. 14, 2000 21 pages.

* cited by examiner

*Primary Examiner*—Thomas P. Noland
(74) *Attorney, Agent, or Firm*—Fish & Richardson P.C.

(57) ABSTRACT

Techniques for evaluating curvatures in line features embedded in a different material layer formed on a substrate. A model based a uniform layer formed over a substrate may be used to represent a structure with parallel line features embedded in a layer formed over the substrate. The curvatures of the uniform layer due to an elastic distortion along a first direction substantially parallel to the line features and along a second direction orthogonal to the first direction are determined. Next, the curvatures of the uniform layer may be used as respective curvatures of each of the line features.

25 Claims, 4 Drawing Sheets

FIG. 3

Use a uniform but anistropic layer to represent line features of a first material embedded in an embedding layer of a second, different material formed over a substrate

↓

Compute the curvatures of the uniform but anistropic layer by neglecting a cross coupling effect by using parameters of the embedded line features and the embedding layer

↓

Use the computed curvatures of the uniform but anistropic layer as curvatures of the embedded line features

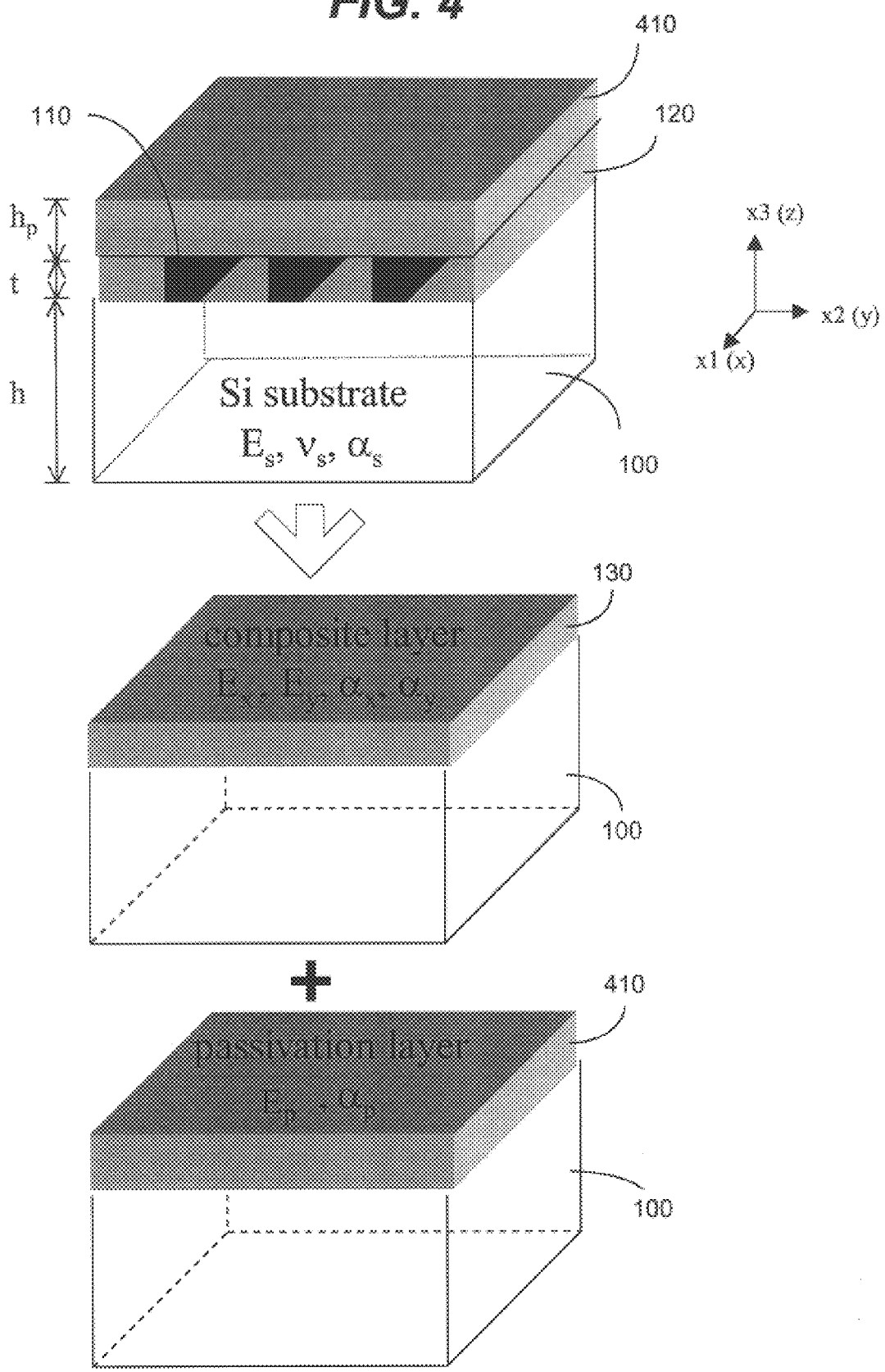

TECHNIQUE FOR DETERMINING CURVATURES OF EMBEDDED LINE FEATURES ON SUBSTRATES

This application is a continuation-in-part application of U.S. application Ser. No. 09/560,719 filed on Apr. 27, 2000. In addition, this application claims the benefit of U.S. Provisional Application No. 60/200,499 filed Apr. 25, 2000.

BACKGROUND

This application relates to evaluation of curvatures and associated properties of line features formed on substrates.

Substrates formed of semiconductors, glasses or other suitable solid-state materials may be used as platforms to support various microstructures integrated to the substrates and to construct a wide range of substrate-based integrated devices. Examples of such substrate-based integrated devices include, among others, integrated electronic circuits, integrated optical devices, micro-electro-mechanical systems, flat panel display systems, or a combination of two or more of the above devices. Typically, various features are formed on a substrate to form a device. One mostly-used feature in substrate-based devices is a line feature which essentially is an elongated feature with one dimension, e.g., length, much greater than the other two dimensions, e.g., width and thickness.

Measurements of changes in stresses and deformation of a substrate and features fabricated on the substrate may have important applications. Different materials and different structures are usually formed on the same substrate and are in contact with one another. Some devices may also use complex multilayer geometry. Hence, the interfacing of different materials and different structures may cause a complex stress state in each feature due to differences in the material properties and the structure at interconnections under different fabrication condition and environmental factors (e.g., variations or fluctuations in temperature). In fabrication of an integrated circuit, for example, the stress state of the interconnect conducting lines may be affected by film deposition, rapid thermal cycling, chemical-mechanical polishing, and passivation during the fabrication process.

It is desirable to measure stresses on various features formed on the substrate to improve the design of the device structure, selection of materials, fabrication process, and other aspects of the devices so that the performance and reliability of the device can be enhanced. The stress measurements may be used to assess or evaluate the reliability of materials against failure from such phenomena as electromigration, stress-voiding and hillock formation. The stress measurements may also be used to facilitate quality control of the mechanical integrity and electromechanical functioning of circuit chip dies during large scale production in wafer fabrication facilities. In addition, the stress measurements may be used to improve the design of various thermal treatments (such as temperature excursions during passivation) and chemical and mechanical treatments (such as polishing) to reduce their contribution to the residual stresses in the final device.

SUMMARY

The present disclosure includes analytical methods to compute curvatures of line features embedded in a medium formed over a substrate based on thermoelastic properties of the structures. Such embedded line features on substrates are used in various substrate-based components and devices. One example is conducting lines (e.g., metal lines) imbedded in an insulator layer (e.g., an oxide or nitride layer) over a semiconductor or other substrate. Curvatures of embedded line features with and without an overlying passivation layer may be calculated. Applications of such analytical methods are also disclosed.

DESCRIPTION OF DRAWINGS

FIG. 3 shows a flow chart of computing the curvatures of the embedded line features based on the model in FIGS. 1 and 2.

FIG. 4 shows a model for line features embedded in a layer on a substrate and capped with a passivation layer.

DETAILED DESCRIPTION

Figure 1:
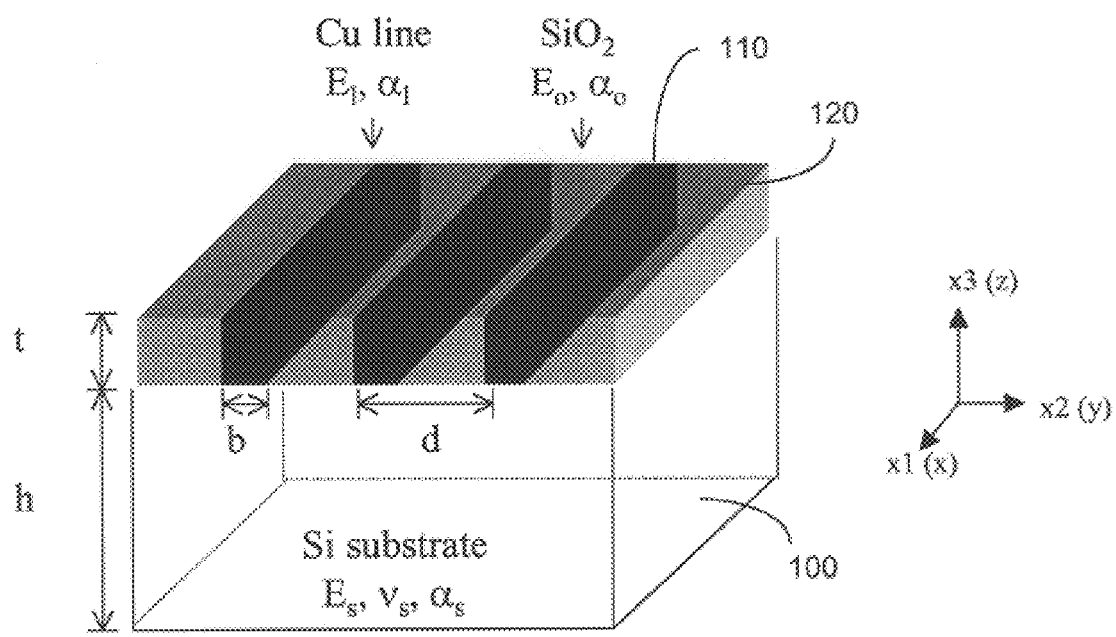
FIGS. 1 and 2 illustrate a model for line features embedded in a layer without a passivation layer on a substrate

In various substrate-based devices, line features formed over a substrate are often embedded in a different material. For example, conductive lines are often embedded in an insulating material such as an oxide or nitride layer formed over the substrate. Copper lines are often fabricated by using a Damascene process where trenches with the same dimensions as the geometry of desired copper interconnect lines are etched in an oxide layer grown on a silicon substrate and then copper is deposited in the trenches to form the embedded copper interconnect lines. Curvatures of such embedded line features associated with elastic properties as represented by parameters such as Young's modulus and Poisson's ratio may be computed based on complex numerical techniques such as finite element method. The numerical techniques, however, generally need extensive computation involving complex numerical codes for a given structure of line features embedded in a medium.

The techniques of this application are designed in part based on the recognition that, curvatures of such embedded line features associated with elastic properties need be computed in a relatively short period of time in some applications. For example, curvatures of embedded line features may be monitored during each fabrication step, i.e., in-situ curvature monitoring, in order to facilitate fabrication of substrate-based components and devices. When the structure is modified by a given amount, e.g., by chemical-mechanical polishing or some other processing operation during a fabrication process, the curvatures of embedded lines as a result of such operation may be needed prior to performance of additional processing operations.

The present techniques use effective thermoelastic properties to represent embedded line features formed on a substrate and to derive simple analytical formulations to directly compute the curvatures of embedded line features. When implemented in a curvature monitoring system, curvatures may be computed in a time period comparable to the processing time of each processing operation so that the computed curvatures may be used to control the next processing operation. This in-situ curvature monitoring mechanism may be applied to various aspects of the substrate fabrication.

For example, this monitoring mechanism may be used to screen out a defective batch of processed substrates at any intermediate stage during the fabrication prior to completion of the entire fabrication processes. It is known that fabrication process and associated thermal cycling can introduce stresses in fabricated features. For example, the various metallization processes are carried out at elevated temperatures. Also, the layers may exhibit different mechanical, physical and thermal properties which can lead to high stresses in interconnection structures due to, e.g., mismatch in the amounts of thermal expansion and contraction between dissimilar materials. These stresses can cause, among others, undesired stress-induced voiding and interfacial cracking, and can contribute to electromigration. In addition, the stresses may cause cracking of the substrate. Voiding, electromigration, and substrate cracking are among the leading failure factors in integrated circuits.

Some of the defects are caused by stresses after an intermediate step during the fabrication. A device is defective when the stresses at various parts exceed predetermined acceptable values. Since the curvatures of embedded line features are indicative of stresses, the above monitoring can be used to assess limiting values of stresses at selected stages or continuously during the fabrication. The measured stresses are compared to the acceptable values. If a measured stress is greater than its acceptable value, a defect is discovered. The fabrication process may be terminated since the final device would be defective. Thus, the remaining fabrication steps need not be carried out. This avoids the wasteful and inefficient practice in some conventional fabrication methods where the defects of the fabricated devices are tested only after the entire fabrication processes are completed.

Another exemplary application of this monitoring mechanism is adjustment and optimization of the processing parameters and conditions in fabrication to reduce the stresses in the substrates. In particular, contributions to the stresses from different processing steps can be identified by monitoring the stresses at each processing step. In addition, processing parameters such as processing temperature or duration of each processing step may be adjusted either independently or in reference with processing parameters of other processing steps to reduce the stresses. Effects on the stresses may be measured upon each adjustment so that a relation between the parameter and the stresses can be established. The steps of adjusting a processing parameter and measuring the resultant stresses may be carried out in an iteration process until the resultant stresses are reduced to satisfactory levels. Hence, the processing steps can be controlled to increase the overall yield of the fabrication.

FIG. 1 shows typical line features 110 embedded in trenches of a layer 120 formed on a substrate 100 in various substrate-based devices. The line features 110 are substantially parallel to one another and are essentially evenly spaced with a pitch, d, on the substrate 100. It is assumed that, the transverse dimension of the substrate 100 is much greater than its thickness h, e.g., by a factor of 10 or greater. It is also assumed that both the thickness, t, and the width, b, of each line feature 110 are much less than the transverse dimensions L and W and the thickness h of the substrate 100, by at least a factor of 10. The accuracy of the models depends on these assumptions and the accuracy generally increases as these factors increase. Under these assumptions, the whole system including line feature 110, trenches of a layer 120 and the substrate 100 may be treated as a homogenized anisotropic plate. A Cartesian coordinate system ($x_1$, $x_2$, $x_3$) is shown. The directions marked $x_1$ and $x_2$ represent the directions along and across the line features 110, respectively, parallel to the substrate 100. The direction marked $x_3$ represents the direction normal to the plane of the substrate 100.

Figure 2:
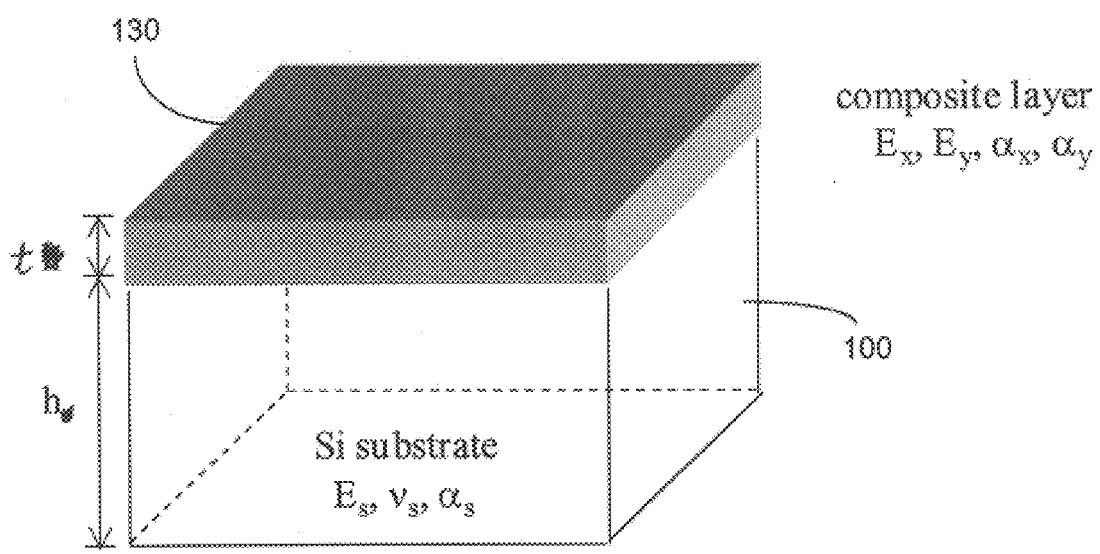

In one embodiment, the embedded line structure shown in FIG. 1 is simplified based on a composite model as the composite structure shown in FIG. 2. The layer comprising the line features 110 (e.g., Cu lines) and the surrounding layer 120 (an oxide such as silicon dioxide) is homogenized as a uniform, anisotropic composite layer 130 with the same thickness t. In addition, this uniform, anisotropic composite layer 130 has Young's moduli $E_1$ and $E_2$ along and across the line direction, respectively, and thermal expansion coefficients, $\alpha_1$ and $\alpha_2$, along and across the line direction, respectively. This anisotropy of the layer 130 is originated from the anisotropic geometry caused by line features 110 and conforming trenches in the layer 120 FIG. 1. The curvatures of the embedded line features 110 in FIG. 1 are now represented and computed by curvatures of this uniform, anisotropic composite layer 130 in the following sections.

This embodiment also assumes that, the aspect ratio, $\alpha_o = t/b$, of the line features 110 and the aspect ratio of the lines formed in surrounding layer 120, $a_f = t/(d-b)$, are comparable to or larger than unity, and that, the curvatures along and across the line features 110 do not affect one another for elastic deformation. The following notation are used: $E_l$, $\nu_l$, and $\alpha_l$ are Young's modulus, Poisson's ratio, and coefficient of thermal expansion for the line features 110, respectively, and $E_o$, $\nu_o$, $\alpha_o$, are Young's modulus, Poisson's ratio, and coefficient of thermal expansion for the layer 120, respectively.

For unpassivated line features 110 in FIG. 1 where there is no additional layer formed over the line features 110 and the layer 120, the curvatures k1 and k2 along two directions x1 and x2 on the uniform, anisotropic layer 130 in FIG. 2 may be considered to cause by two bending moments $M_x$ and $M_y$ along x1 and x2 directions due to a change $\Delta T$ in temperature, respectively. The associated volume-averaged stresses are given by $<\sigma_1> = -E_1(\alpha_1 - \alpha_s)\Delta T$ and $<\sigma_2> = -E_2(\alpha_2 - \alpha_s)\Delta T$, where $\alpha_s$ is the thermal expansion coefficient of the substrate. Therefore, the following can be established:

$$M_1 = \langle\sigma_1\rangle t\left(\frac{h}{2}\right) = \frac{E_s h^3}{12(1-\nu_s^2)}(k_1 + \nu_s k_2), \tag{1}$$

$$M_2 = \langle\sigma_2\rangle t\left(\frac{h}{2}\right) = \frac{E_s h^3}{12(1-\nu_s^2)}(k_2 + \nu_s k_1). \tag{2}$$

In this uniform, anisotropic layer 130, the curvature in one direction includes contribution from the thermal stress resulting from the thermal mismatch in the other direction. This cross coupling effect between the two orthogonal directions x1 and x2 is generally small due to the inclusion of the Poisson ratio and hence will be neglected in the following computation. The validity of this assumption can be evaluated in comparison with a detailed analysis based on the finite element method. The curvatures, therefore, can be approximately expressed as $$k_1 = \frac{6}{E_s}\frac{t}{h^2}E_1(\alpha_1 - \alpha_s)\Delta T, \tag{3}$$

$$k_2 = \frac{6}{E_s}\frac{t}{h^2}E_2(\alpha_2 - \alpha_s)\Delta T. \tag{4}$$

The thermal expansion coefficients $\alpha_1$ and $\alpha_2$ can be computed by the parameters of the structure in FIG. 1. The thermal expansion are assumed to be the same along the line features 110 and the lines formed of the material of the layer 120 due to presence of line features 110 in the layer 120:

$$\alpha_l \Delta T = \frac{\langle \sigma_l \rangle}{E_l} + \alpha_l \Delta T = \frac{\langle \sigma_o \rangle}{E_o} + \alpha_o \Delta T \qquad (5)$$

where the temperature change $\Delta T$ is assumed to be within the elastic range of the structure, $\langle \sigma_l \rangle$ and $\langle \sigma_o \rangle$ are the volume-averaged stresses in the line features 110 trenches in the layer 120, respectively. A force balance of this geometry provides:

$$f_l \langle \sigma_l \rangle + f_o \langle \sigma_o \rangle = 0. \qquad (6)$$

Furthermore, in the $x_2$ direction across the line features 110, the thermal expansion in the line features 110 and in the trench 120, and the Poisson effect also requires:

$$\alpha_2 \Delta T = f_l \left[ -\nu_l \frac{\langle \sigma_l \rangle}{E_l} + \alpha_l \Delta T \right] + f_o \left[ -\nu_o \frac{\langle \sigma_o \rangle}{E_o} + \alpha_o \Delta T \right]. \qquad (7)$$

Based on the above, the curvature $k_1$ of the line features 110 along the line direction $x_1$ and the curvature $k_2$ perpendicular to the line direction $x_2$ caused by a change in temperature, $\Delta T$, within the elastic range can be calculated by Eqs. (3) and (4) by using the following effective thermoelastic properties:

$$E_1 = f_l E_l + f_o E_o = \frac{b}{d} E_l + \left(1 - \frac{b}{d}\right) E_o, \qquad (8)$$

$$E_2 = \frac{E_l E_o}{f_l E_0 + f_0 E_l}, \qquad (9)$$

$$\alpha_1 = \frac{f_l E_l \alpha_l + f_0 E_0 \alpha_0}{f_l E_l + f_o E_o}, \qquad (10)$$

$$\alpha_2 = f_l \alpha_l + f_o \alpha_o + \frac{f_l f_o (\nu_l E_o - \nu_o E_l)(\alpha_l - \alpha_0)}{f_l E_l + f_o E_o}. \qquad (11)$$

Hence, when the structure dimensions and the material properties are known, the longitudinal and transverse curvatures of the embedded lines features 110 can be readily computed based on the above analytical equations without extensive numerical computation steps. When the structure dimensions change, e.g., due to a fabrication process, the effects of such change can be directly computed in a nearly real-time manner when a proper microprocessor is used. FIG. 3 is a flow chart of the above technique shown in FIGS. 1 and 2.

In substrate-based devices, line features 110 such as a conductor lines formed of metals or other conducting materials may be covered by a passivation layer to protect the conductor lines. In another embodiment, this passivated structure may be represented by superposition of an unpassivated structure shown in FIG. 1 and a structure with the passivation layer directly formed over the substrate as far as elastic deformation is concerned. Therefore, the curvatures of the line features is the sum of the curvatures computed based on the technique shown in FIGS. 1–3 and the curvature of the passivation layer directly formed on the substrate under the same temperature excursion.

FIG. 4 illustrates this embodiment where the passivation layer is the layer 410 formed over the line features 110 and the layer 120. Assuming the passivation layer 410 is much thinner than the substrate 100, the curvature of the passivation layer 410 directly formed on the substrate 100, due to elastic deformation caused by a change $\Delta T$ in temperature, can be expressed as $$k_p = 6 \frac{h_p}{h^2} \cdot \frac{E_p}{E_s} \cdot \frac{(1 - \nu_s)}{(1 - \nu_p)} (\alpha_p - \alpha_s) \Delta T, \qquad (12)$$

where $E_p$, $\nu_p$, $\alpha_p$, $h_p$ are Young's modulus, Poisson's ratio, coefficient of thermal expansion, and thickness for the passivation layer 410, respectively. Hence the curvatures of the passivated line features are $$k_1^{pass} = k_1 + k_p \qquad (13)$$

$$= \frac{6}{E_s} \frac{t}{h^2} E_1 (\alpha_1 - \alpha_s) \Delta T + 6 \frac{h_p}{h^2} \cdot \frac{E_p}{E_s} \cdot \frac{(1 - \nu_s)}{(1 - \nu_p)} (\alpha_p - \alpha_s) \Delta T,$$

$$k_2^{pass} = k_2 + k_p \qquad (14)$$

$$= \frac{6}{E_s} \frac{t}{h^2} E_2 (\alpha_2 - \alpha_s) \Delta T + 6 \frac{h_p}{h^2} \cdot \frac{E_p}{E_s} \cdot \frac{(1 - \nu_s)}{(1 - \nu_p)} (\alpha_p - \alpha_s) \Delta T.$$

The predictions of this simple analysis have been shown to be reasonably close to the results of more detailed finite element methods, with a deviation from about 3% to about 17%. For some practical configurations of Cu lines in oxide trenches, where aspect ratio of lines is equal to and/or higher than 1, the error is typically smaller than 5%.

One application of the above technique for determining the curvatures of embedded lines is to determine stresses that cause the curvatures based on a correlation between the curvature change and the stress. Such a correlation is well known. Examples of theoretical models for such correlation include Stoney's approximate plate theory disclosed in Proceedings of the Royal Society, London, Series A, vol. 82, pp. 172(1909), Finot and Suresh's approximate plate theory disclosed in Journal of the Mechanics and Physics of Solids, vol. 44(5), pp. 683(1996), and a continuum mechanics formulation developed by Freund, Journal of Crystal Growth, vol. 132, pp. 341 (1993) and Journal of the Mechanics and Physics of Solids, vol. 44(5), pp.723 (1996). For example, in the unpassivated embedded line structure shown in FIG. 1, the volume averaged stresses, $\langle \sigma_{11} \rangle$ and $\langle \sigma_{22} \rangle$ in the plane of x1–x2 of parallel line features 110 may be expressed in terms of curvature components as below:

$$\begin{bmatrix} f^1 \langle \sigma_{11}^1 \rangle + f^0 \langle \sigma_{11}^0 \rangle \\ f^1 \langle \sigma_{22}^1 \rangle + f^0 \langle \sigma_{22}^0 \rangle \end{bmatrix} = -\frac{1}{6} \frac{h^2}{t} \frac{E_s}{1 - \nu_s^2} \begin{bmatrix} 1 & \nu_s \\ \nu_s & 1 \end{bmatrix} \begin{bmatrix} \kappa_1 \\ \kappa_2 \end{bmatrix}$$

wherein the superscript 'l' denotes embedded lines 110 and superscript 'o' denotes the layer 120 embedding lines 110. This stress-curvature relation is generally valid when the layer including 110 and 120 is much thinner than the substrate 100.

The above techniques can be used to compute the curvatures of embedded lines on the substrate based on certain known parameters of the substrate-based devices. The information on the curvatures and changes in curvatures, in turn, may be used to analyze associated stresses in the device structure. Therefore, this thermoelastic curvature analysis can be extended to thermoelastic volume-averaged stresses in embedded line structure The above analytical technique may also be used to analyze residual stresses in additional to thermoelestic stresses when combined with a curvature-measuring technique. Assume the actual curvatures can be measured by using a proper technique. It is contemplated that a comparison between the measured curvatures and computed curvatures based on the above models can be used to determine whether residual stresses beyond the stresses caused by elastic distortion exist in the devices. Although the elastic stress from thermal mismatch computed by this analysis also affects failure of interconnect lines such as voiding, residual stresses involving other mechanisms than thermoelastic deformation such as streesses resulted from film deposition and subsequent fabrication processes may also affect the reliability of devices.

Figure 5:
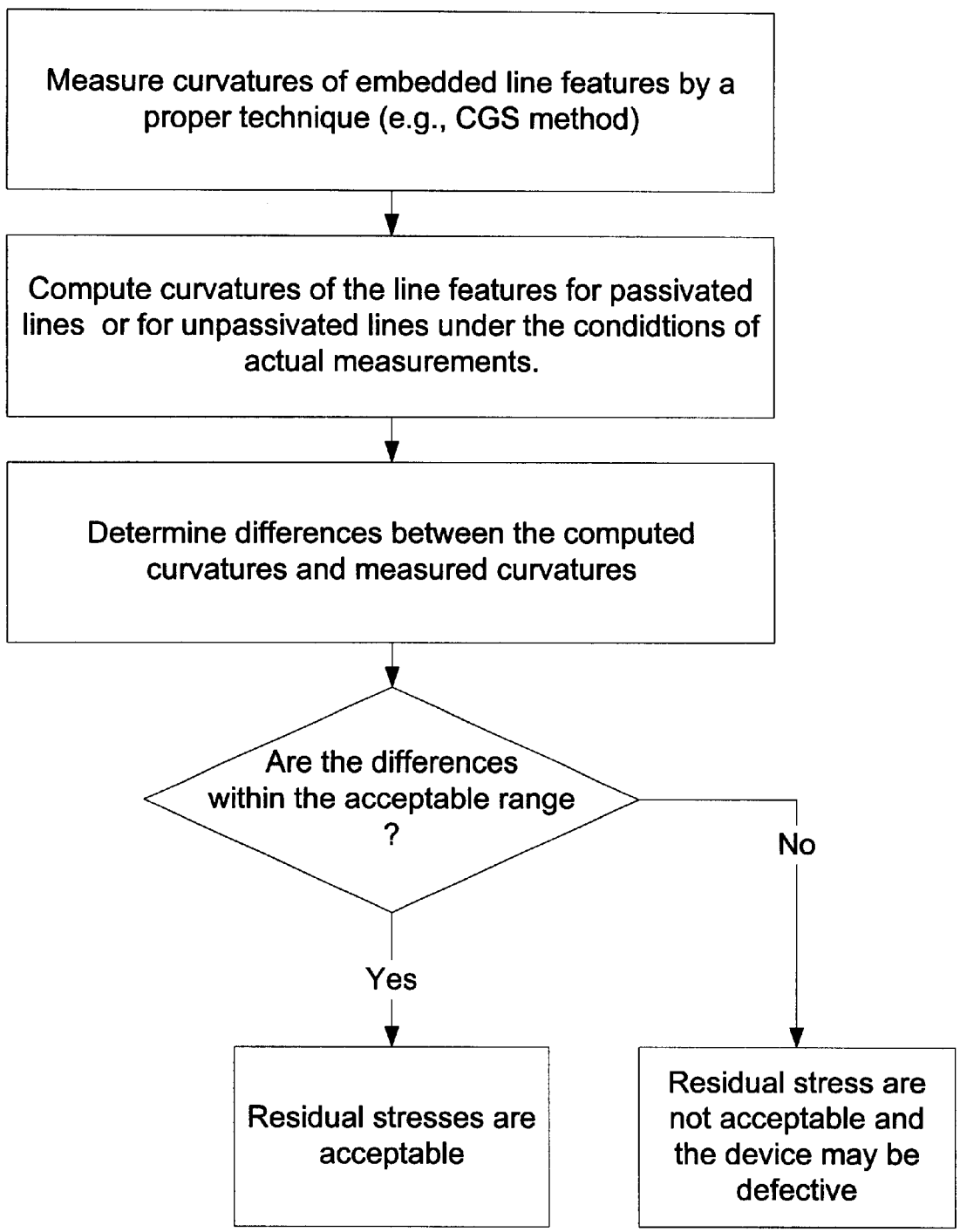
FIG. 5 shows a flowchart for analyzing residual stress in embedded line features.

FIG. 5 shows a flowchart of combining the real-time measurements with the curvature estimation based on the above models to determine the stress information of the embedded lines. First, the curvatures of embedded lines of a device are measured and computed based on the models in FIGS. 1–4. The measurements provide actual curvatures of the lines while the computed curvatures are only the curvatures caused by thermoelastic deformation. Next, the computed curvatures and the measured curvatures are compared. Their differences indicate the curvatures caused by residual stresses which are not included in the thermal elastic computation. This residual stress may include stresses caused by a number of non-elastic factors, such as intrinsic stress during film deposition, the process-induced stress from chemical-mechanical polishing. The difference between actual and calculated curvatures can be also contributed from inelastic deformation such as plastic deformation and/or creep during thermal cycling. The residual stress should be kept below an acceptable level in order to ensure the normal operation and a desired lifetime of the device. Hence, when the difference either along or cross the line exceeds the acceptable level, the reliability or performance of a device may be considered as being unacceptable.

Various techniques may be used to measure the actual curvatures of the embedded lines. For example, an optical detection mechanism may be used to provide a non-invasive, full-field measuring capability to simultaneously measure curvatures of one or more areas where line features are located, without the conventional point-to-point scanning measurement. The curvature information is then used to directly compute the stresses based on an analytical formulation to eliminate complex numerical computation. Hence, the stress information can be obtained within a short processing time. This combination of the full-field optical detection and the processing can produce a spatial map of the stress distribution in the area under measurement in virtually real time so long as the change in the stress is slower than the processing time.

One suitable optical curvature measuring technique is the optical coherent gradient sensing (CGS) technique disclosed in U.S. Pat. No. 6,031,611 and U.S. application Ser. No. 09/560,719. The CGS system uses a collimated coherent optical beam as an optical probe to obtain curvature information indicative of a specularly reflective surface formed of essentially any material. When the reflective surface is curved, the wavefront of the reflected probe beam is distorted and thereby acquires an optical path difference or phase change associated with the curvature of the surface under measurement. This system produces a "snapshot" of each point within the illuminated area on the surface. Two gratings spaced from each other are placed in the path of the reflected probe beam to manipulate the distorted wavefront for curvature measurement. Two diffraction components produced by the second grating diffracting two different diffraction components produced by the first grating are combined to interfere with each other. The diffraction by the two gratings effectuates a relative spatial displacement, i.e., a phase shift between the two selected diffraction components to extract a spatial gradient of the phase distortion caused by the curvature of the reflective surface. This spatial gradient, in turn, can be further processed to obtain the curvature information and hence a curvature map of the illuminated area on the surface can be obtained.

The above process can be used to monitor the stresses in the embedded lines during the fabrication process because the CGS is capable of in-situ measurements. The differences in curvatures between the analysis and CGS measurements provide an indication of what is actually going on with respect to stress/curvature evolution that is not accounted for in design. Hence, one or more aspects of the fabrication or the design of the devices may be examined and modified to reduce the residual stresses within the acceptable range. In addition, the in-situ measurements may also be used to terminate the fabrication prior to the completion of the entire process if the residual stresses exceed above the acceptable level at an intermediate step. This monitoring mechanism may reduce the cost and increases fabrication efficiency.

Equations (3), (4) and (13), and (14) may also be used to fit measured curvature data to determine a property of the line features or the substrate, such as the Young's modulus, the coefficient of the thermal expansion, and Poisson ratio of the substrate or the line feature. For example, in devices with the passivation layer 410, the CGS measurements of the curvatures may be used to determine properties of the passivation layer 410 based on Equations (13) and (14). The biaxial modulus of the passivation layer 410, $E_{p,B}=E_p/(1-v_p)$ can be computed from the CGS measurements of $k_1^{pass}$ and $k_2^{pass}$ that are made during the process before and after the passivation layer is deposited.

The above method for measuring embedded lines can be applied to a new fabrication technique for making copper conductive lines in oxide trenches, "Damascene process." With this technique, trenches are etched in an oxide layer to conform to the geometry of the copper interconnect lines in the circuit formed on a Si substrate. The etching is performed by using a dry etching process. These oxide trenches are then plugged with Cu with the use of chemical vapor deposition (CVD) or electroplating. The extra copper above the trenches is then removed by chemical-mechanical polishing (CMP), and then a passivation or a capping layer is deposited on top of the interconnect structure.

Since the Damascene process involves material removal by polishing, the knowledge of curvature evolution during polishing and subsequent processing is essential on various counts. For example, in-situ monitoring of curvatures using the CGS method can provide information on the "flatness" of the polished surface upon which layers are deposited. This can be an essential step in quality control. Also, a knowledge of curvature evolution can also give an indication of the evolution of internal stresses during fabrication.

Furthermore, the above analysis for unpassivated and passivated lines can also be used to simulate the evolution of elastic stresses during thermal cycling, and can be readily compared with CGS measurements. Examples of such calculations are given in Park and Suresh, "Effects of Line and Passivation Geometry on Curvature Evolution during Processing and Thermal Cycling in Copper Interconnect Lines," Acta Materialia Vol. 48, 3169–3175 (2000) and are verified by comparisons with finite element simulations.

A number of embodiments of the invention have been described. Nevertheless, it will be understood that various modifications and enhancements may be made without departing from the following claims.

What is claimed is:

1. A method, comprising:
   providing a model with a uniform layer formed over a substrate to represent a structure with parallel line features embedded in a layer formed over a substrate, wherein the line features are formed of a material different from the layer;

determining curvatures of the uniform layer due to an elastic distortion along a first direction substantially parallel to the line features and a second direction orthogonal to the first direction; and using the curvatures of the uniform layer as respective curvatures of each of the line features.

2. The method as in claim 1, wherein the curvatures are determined based on dimension and material properties of the parallel line features, the layer, and the substrate.

3. The method as in claim 2, further comprising using an analytical function of the dimension and material properties to compute the curvatures of the uniform layer.

4. The method as in claim 2, wherein the dimension and material properties include a thickness, thermal expansion coefficient, and Young's modulus of the substrate.

5. The method as in claim 2, the dimension and material properties include dimensions, Poisson's ratio, thermal expansion coefficients, and Young's moduli of the line features and the layer.

6. The method as in claim 1, further comprising:

measuring actual curvatures of the line features of the structure;

determining differences between the determined curvatures from the model and the measured curvatures; and extracting information about the line features based on the differences.

7. The method as in claim 6, further comprising using an optical sensing technique to measure the actual curvatures of the line features.

8. The method as in claim 6, wherein the information about the line features includes information on residual stresses.

9. The method as in claim 6, wherein an elastic property of the structure is not known, and further comprising using the measured curvatures to obtain information on the unknown elastic property.

10. A method, comprising:

providing a model to represent a structure that has parallel line features embedded in a layer formed over a substrate and a passivation layer formed over the line features and the layer, wherein the line features, the layer, and the passivation layer are formed of different materials, wherein the model includes a first structure model having a uniform layer formed over the substrate to represent the line features and the layer and second structure model having the passivation layer directly formed over the substrate;

determining curvatures of the uniform layer in the first structure model due to an elastic distortion along a first direction substantially parallel to the line features and a second direction orthogonal to the first direction;

determining a curvature of the passivation layer in the second structure model due to an elastic distortion; and adding the determined curvature of the passivation layer to the determined curvatures of the uniform layer as respective curvatures of each of the line features.

11. The method as in claim 10, wherein the curvatures of the uniform layer are determined based on dimension and material properties of the parallel line features, the layer, and the substrate.

12. The method as in claim 11, further comprising using an analytical function of the dimension and material properties to compute the curvatures of the uniform layer.

13. The method as in claim 11, wherein the dimension and material properties include a thickness, thermal expansion coefficient, and Young's modulus of the substrate.

14. The method as in claim 11, the dimension and material properties include dimensions, Poisson's ratio, thermal expansion coefficients, and Young's moduli of the line features and the layer.

15. The method as in claim 10, further comprising:

measuring actual curvatures of the line features of the structure;

determining differences between the determined curvatures from the model and the measured curvatures; and extracting information about the line features based on the differences.

16. The method as in claim 15, further comprising using an optical coherent gradient sensing technique to measure the actual curvatures of the line features.

17. The method as in claim 15, wherein the information about the line features includes information on residual stresses.

18. The method as in claim 15, wherein an elastic property of the structure is not known, and further comprising using the measured curvatures to obtain information on the unknown elastic property.

19. A method, comprising:

providing a model with a uniform layer with anisotropic elastic parameters formed over a substrate to represent a structure with parallel line features embedded in a layer formed over a substrate, wherein the line features are formed of a material different from the layer;

using an analytical function of dimension and material parameters of the line features, the layer, and the substrate to compute curvatures of the uniform layer due to an elastic distortion along a first direction substantially parallel to the line features and a second direction orthogonal to the first direction; and using the curvatures of the uniform layer as respective curvatures of each of the line features.

20. The method as in claim 19, wherein the dimension and material parameters include a thickness, thermal expansion coefficient, and Young's modulus of the substrate.

21. The method as in claim 19, the dimension and material parameters include dimensions, Poisson's ratio, thermal expansion coefficients, and Young's moduli of the line features and the layer.

22. The method as in claim 19, further comprising:

measuring actual curvatures of the line features of the structure;

determining differences between the determined curvatures from the model and the measured curvatures; and extracting information about the line features based on the differences.

23. The method as in claim 22, further comprising using the differences to extract information on stresses caused by effects other than thermoelastic deformation.

24. The method as in claim 19, wherein the structure includes a passivation layer formed over the line features and the layer, and further comprising:

determining a curvature of the passivation layer when the passivation layer is directly formed over the substrate; and adding the determined curvature of the passivation layer to the determined curvatures of the uniform layer as respective curvatures of each of the line features to account for an effect of the passivation layer on the line features and the layer.

25. The method as in claim 19, further comprising using the curvatures to determine stresses caused by thermoelastic deformation.

* * * * *